(12) United States Patent
Knier et al.

(10) Patent No.: US 11,697,230 B2
(45) Date of Patent: Jul. 11, 2023

(54) METHOD AND TOOL FOR MOLDING AN ELECTRONIC MODULE, AND MOLDED ELECTRONIC MODULE

(71) Applicant: ZF Friedrichshafen AG, Friedrichshafen (DE)

(72) Inventors: Marco Knier, Pegnitz (DE); Thomas Deichler, Sulzbach-Rosenberg (DE); Christoph Schikora, Regensburg (DE)

(73) Assignee: ZF Friedrichshafen AG, Friedrichshafen (DE)

( * ) Notice: Subject to any disclaimer, the term of this patent is extended or adjusted under 35 U.S.C. 154(b) by 120 days.

(21) Appl. No.: 16/750,893

(22) Filed: Jan. 23, 2020

(65) Prior Publication Data

US 2020/0230853 A1 Jul. 23, 2020

(30) Foreign Application Priority Data

Jan. 23, 2019 (DE) .......................... 102019200768.6

(51) Int. Cl.
*B29C 45/14* (2006.01)
*H05K 7/20* (2006.01)
(Continued)

(52) U.S. Cl.
CPC ..... *B29C 45/14065* (2013.01); *H05K 1/0203* (2013.01); *H05K 5/065* (2013.01);
(Continued)

(58) Field of Classification Search
CPC .... B29C 45/14; B29C 45/14065; H05K 5/065
See application file for complete search history.

(56) References Cited

U.S. PATENT DOCUMENTS

| 5,932,254 A | 8/1999 | Mitchell et al. |
| 2006/0040094 A1* | 2/2006 | Mizuno ................. H01C 10/32 428/209 |

FOREIGN PATENT DOCUMENTS

| DE | 196 12 765 A1 | 11/1997 |
| DE | 197 54 616 A1 | 6/1998 |

(Continued)

OTHER PUBLICATIONS

Office Action dated Jun. 12, 2019 for German Patent Application No. 10 2019 200 768.6, (14 pp.), note: pp. 1 and 2 are English language Explanations to Section C. Result of Determination Document.

*Primary Examiner* — James Sanders
(74) *Attorney, Agent, or Firm* — Crowell & Moring LLP

(57) ABSTRACT

A method may include coating an electronic module in a tool, where the electronic module has a first sub-module and a second sub-module, where the tool has a first tool part and a second tool part, where the tool has a cavity at least partially formed between the first tool part and the second tool part, and where the first sub-module and the second sub-module are supported on the tool and held in the cavity at a spatially defined distance relative to one another in a contactless manner during the coating process. A tool for performing such method may include a first tool part and a second tool part that form a cavity, where the first tool part has a first molding surface section and at least one first supporting section that extends over the first molding surface section and the second tool part has a second molding surface section and at least one second supporting section that extends over the second molding surface section.

7 Claims, 2 Drawing Sheets

(51) Int. Cl.
*H05K 5/06* (2006.01)
*H05K 1/02* (2006.01)
*B29L 31/34* (2006.01)

(52) U.S. Cl.
CPC ....... *H05K 7/2039* (2013.01); *H05K 7/20854* (2013.01); *B29L 2031/3425* (2013.01); *H05K 2201/066* (2013.01)

(56) References Cited

FOREIGN PATENT DOCUMENTS

| | | |
|---|---|---|
| DE | 10 2004 010 904 A1 | 9/2005 |
| DE | 10 2013 114 136 A1 | 6/2015 |
| DE | 10 2015 207 310 A1 | 10/2016 |
| DE | 10 2016 220 755 A1 | 4/2018 |
| DE | 10 2016 220 756 A1 | 4/2018 |

* cited by examiner

METHOD AND TOOL FOR MOLDING AN ELECTRONIC MODULE, AND MOLDED ELECTRONIC MODULE

RELATED APPLICATION

This application claims the benefit and priority of German Patent Application DE 10 2019 200 768.6, filed Jan. 23, 2019, which is incorporated by reference herein in its entirety.

BACKGROUND

An electronic module for a control device in a vehicle is known from DE 10 2015 207 310 A1 that has at least one circuit carrier that has electronic components forming a control unit and at least one electronic component that is electronically connected to the circuit carrier via a connecting region, in which the components of the circuit carrier and each connecting region between the circuit carrier and each dedicated electronic component are coated with encapsulating material.

A heat dissipating assembly is known from DE 10 2016 220 755 A1, comprising a circuit board that has electrically conductive and/or electronic components arranged thereon, and a thermally conductive element located on the circuit board and over the components, wherein the thermally conductive element has a porous surface at one or more predefined surface areas at which it is in contact with one or more components, and wherein the porous surface is provided with a heat conducting medium.

A heat conducting assembly is known from DE 10 2016 220 756 A1, wherein the heat conducting assembly has at least one power module that has a circuit board with components on a first side and/or the second side, lying opposite the first side, and/or through holes between the first and second side of the circuit board, and at least one heat sink on at least one side of the circuit board placed over at least the components that are to be cooled, wherein at least one heat sink is located on at least one side of the circuit board on at least one of the components, which has a predefined structure that extends away from the circuit board into the heat sink, and/or at least one heat conducting element is inserted through at least one of the through holes in order to form a thermal connection to components on the other side of the circuit board.

DETAILED DESCRIPTION

Figure 1:
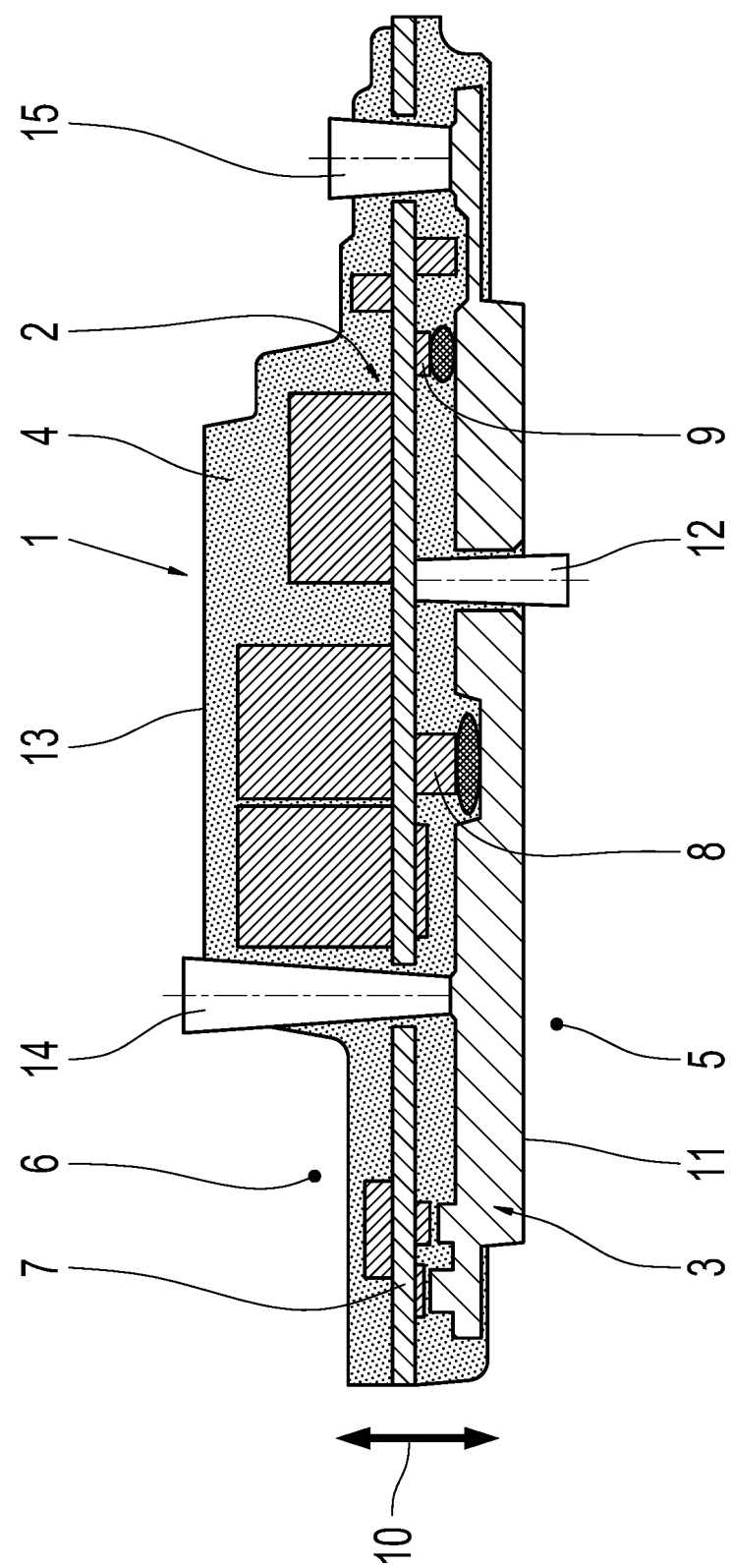
FIG. 1 shows a coating of an electronic module that has a first sub-module and a second sub-module in a tool that has a first tool part and a second tool part.

The present disclosure relates to a method for coating an electronic module in a tool, in which the electronic module has a first sub-module and second sub-module, the tool has a first tool part and a second tool part, and a cavity formed by the first tool part and the second tool part. The present disclosure also relates to a tool for coating an electronic module according to this method, in which the tool has a first tool part and a second tool part for forming a cavity. The present disclosure also relates to a molded electronic module that has a first sub-module, a second sub-module, and a molding material.

A fundamental object of certain embodiments described herein is to improve on the methods specified in the introduction. Another fundamental object of certain embodiments described herein also concerns improving the structure and/or functioning of the tool specified in the introduction. Furthermore, a fundamental object certain embodiments of the present disclosure concerns the improvement of the structure and/or functioning of the electronic module specified in the introduction.

The method can be automated. The method can be carried out in a mass production. The coating can serve to connect the first sub-module to the second sub-module. The coating can also serve to prevent the electronic module from becoming impaired or damaged, in particular the first sub-module and/or second sub-module, by a medium, in particular dirt and/or moisture, e.g. oil or lubricants. The coating can also serve to protect the electronic module, in particular the first sub-module and/or second sub-module, at least partially, from environmental effects, in particular penetrating media, in particular dirt and/or moisture, e.g. oil or lubricants. The electronic module, in particular the first sub-module and second sub-module, can be entirely or partially coated. In this regard, the coating can also be referred to as a molding.

The first sub-module and second sub-module can first be placed and/or oriented in a defined manner in the open cavity for the coating. The cavity can be subsequently closed. The first sub-module and/or second sub-module can be secured in place prior to and/or while closing the cavity. The first sub-module and second sub-module can be supported on the tool in a force and/or form fitting manner. The first sub-module and second sub-module can be kept mechanically apart from one another in a contactless manner. In the present context, "contactless" can mean, in particular, that the first sub-module and second sub-module are not in direct mechanical contact with one another. The first sub-module and second sub-module can be kept out of contact to one another at a predetermined spacing. The first sub-module and second sub-module can be kept in a defined space within the cavity. The first sub-module and second sub-module can be retained such that they do not overlap and/or become deformed in the coating process, in particular with different flow fronts.

The first sub-module and/or second sub-module can supported in place and/or clamped in place. The first sub-module can be clamped between the first tool part and the second tool part. The first tool part can have at least a first supporting section. The second tool part can have at least a second supporting section. The first sub-module can be retained on the at least one first supporting section. The second sub-module can be clamped between the at least one first supporting section and the at least one second supporting section.

The first sub-module can have at least a first recess for the at least one second supporting section. The second sub-module can have at least one second recess for the at least one first supporting section. The first sub-module can be located with the first recess on the at least one second supporting section such that it can be displaced. The second sub-module can be located with the at least one second recess on the at least one first supporting section such that it can be displaced. A sub-module can be located on a supporting section in a supporting plane such that it can be displaced. There can be a gap between an edge of a recess and a supporting section.

The first sub-module and second sub-module can be connected to one another through the coating. The first sub-module and/or second sub-module can be at least partially coated such that they are media-tight.

The tool can be an injection molding tool. The tool can contain at least one other tool part. The first tool part and second tool part can be displace in relation to one another in order to open or close the cavity. The tool can contain a separating plane between the first tool part and the second tool part that is at an angle, in particular a right angle, to the opening and/or closing direction.

The first molding surface section can form a first partial cavity. The at least one first supporting section can extend from the first molding surface section toward the second molding surface section. The at least one first supporting section can extend over the first molding surface section toward the second molding surface section. The at least one first supporting section can be located partially or entirely within the first partial cavity. The at least one first supporting section can extend in the opening and/or closing direction of the tool. The at least one first supporting section can have and end dedicated to the first molding surface section and a free end. The at least one first supporting section can have at least one first retaining section. The at least one first retaining section can be located on the free end.

The second molding surface section can form a second partial cavity. The at least one second supporting section can extend from the second molding surface section toward the first molding surface section. The at least one second supporting section can extend over the second molding surface section toward the firsts molding surface section. The at least one second supporting section can be located partially or entirely within the second partial cavity. The at least one second supporting section can extend in the opening and/or closing direction of the tool. The at least one second supporting section can have an end dedicated to the second molding surface section and a free end. The at least one second supporting section can have at least one second retaining section. The at least one second retaining section can be located on the free end.

A first supporting plane can be formed by the at least one first supporting section, in particular the at least one first retaining section. The first supporting plane can run at an angle, in particular a right angle, to and opening and/or closing direction of the tool. A second supporting plane can be formed by the at least one second supporting section, in particular the at least one second retaining section. The second supporting plane can run at an angle, in particular a right angle, to an opening and/or closing direction of the tool. The first supporting plane and second supporting plane can be parallel to one another. The first supporting plane can be between the second molding surface section and the second supporting plane. The second supporting plane can be between the first molding surface section and the first supporting plane.

The at least one first supporting section and the at least one second supporting section can be offset to one another. The at least one first supporting section can be conical. The at least one first supporting section and have demolding bevels. The at least one first supporting section can be tapered. The at least one second supporting section can be conical. The at least one second supporting section can have demolding bevels. The at least one second supporting section can be tapered.

The electronic module can be used in a vehicle. The electronic module can be used in an electric control element. The electronic module can be used in an environment exposed to a media, in particular dirt and/or moisture, e.g. oil or lubricants. The electronic module can be used for electrically controlling a drive train module, in particular a transmission. The coating material can form a layer between the first sub-module and the second sub-module. The first sub-module and/or second sub-module can be encompassed entirely or partially with a coating material such that it is media-tight. The coating material can be a thermosetting plastic.

The first sub-module can have at least one first recess for the at least one second supporting section. The at least one first recess can have a shape adapted and/or dimensioned to the at least one second supporting section. The at least one first recess can be adapted and/or dimensioned such that there is a gap filled with coating material between an edge of the at least one first recess and the second supporting section. The second sub-module can have at least one second recess for the at least one first supporting section. The at least one second recess can have a shape adapted and/or dimensioned to the at least one first supporting section. The at least one second recess can be adapted and/or dimensioned such that there is a gap filled with coating material between an edge of the at least one second recess and the first supporting section.

The first sub-module can contain a circuit board and at least one electronic component. The circuit board can serve as a carrier for the at least one electronic component and/or for forming an electrical contact to the at least one electronic component. The at least one electronic component can be located on a side of the circuit board facing the second sub-module or on a side of the circuit board facing away from the second sub-module. The second sub-module can be a heat conducting element. The second sub-module can also serve to conduct heat from an interior of the electronic module to an exterior of the electronic module. The second sub-module can be plate-shaped. The second sub-module can have at least one counter-supporting section for the at least one second supporting section of the second tool part.

A heat conducting medium can be located between the first sub-module and the second sub-module. The heat conducting medium can be located between the at least one electronic component and the second sub-module. The heat conducting medium can support thermal conduction from the first sub-module, in particular the at least one electronic component, to the second sub-module. The heat conducting medium can fill a gap between the first sub-module, in particular the at least one electronic component, and the second sub-module.

A connection between the sub-modules of the electronic module is improved with the invention. A medium-tightness is increased. The formation of gaps is prevented. A disadvantageous effect of chemical and/or thermal shrinkage is prevented. Impairment or damage to the electronic module, in particular the sub-modules, by media, in particular dirt and/or moisture, e.g. oil or lubricants, is prevented. Deformation of the electronic module, in particular the sub-modules, is prevented. The sub-modules can be displaced in relation to one another due to the effects of chemical and/or thermal shrinkage. Tensions caused by shrinkages are reduced or prevented, thus preventing delamination and/or undesired deformation.

An exemplary embodiment of the invention shall be explained in greater detail below in reference to the figures.

FIG. 1 shows a coating of an electronic module 1 that has a first sub-module 2 and a second sub-module 3 with a coating material 4 in a tool that has a first tool part 5 and a second tool part 6. The electronic module can be used in an electrical control element in a vehicle in an environment exposed to oil. The first sub-module 2 has a circuit board 7 and electronic components 8, 9. The second sub-module 3 forms a heat sink, and is used to discharge heat from the first sub-module 2.

The first tool part 5 and the second tool part 6 form a cavity that can be opened and closed by moving the tool parts 5, 6 in relation to one another in a direction 10. The first tool part 5 has a first molding surface section 11 and a first supporting section 12 that extends over it. The second tool part 6 has a second molding surface section 13 and a second supporting sections 14, 15 that extends over it. The first supporting section 12 extends from the first molding surface section 11 toward the second molding surface section 14. The second supporting sections 14, 15 extend from the second molding surface section 13 toward the first molding surface section 11.

A first supporting plane for the first sub-module 2 is formed by the first supporting section 12. A second supporting plane for the second sub-module 3 is formed by the second supporting sections 14, 15. The first supporting plane and the second supporting plane are spaced apart and parallel to one another. The first supporting plane is located between the second molding surface section 13 and the second supporting plane. The second supporting plane is located between the first molding surface section 11 and the first supporting plane. The first supporting section 12 and the second supporting sections 14, 15 are offset to one another and conical.

The circuit board 7 has recesses for the second supporting sections 14, 15 that are adapted and/or dimensioned such that there is a gap that can be or is filled with coating material 4 between an edge of the recess and the second supporting sections 14, 15. The second sub-module 7 has a second recess for the first supporting section 12, that is adapted and/or dimensioned such that there is a gap that can be or is filled with coating material between an edge of the second recess and the first supporting section 12. The second sub-module 7 has counter-supporting sections for the second supporting sections 14, 15.

The first sub-module 2 and second sub-module 3 are first placed in the cavity and/or oriented on the supporting sections 12, 14, 15 for the coating process, wherein the first sub-module 2 is located in the first supporting plane and the second sub-module 3 is located in the second supporting plane, such that the first sub-module 2 and the second sub-module 3 are retained at a predetermined spacing to one another such that they are mechanically contactless and retained in a spatially defined manner in relation to the cavity. The cavity is subsequently closed. The first sub-module 2 is than placed on the first supporting section 12 and the second sub-module 3 is clamped between the first supporting section 12 and the second supporting sections 14, 15. The first sub-module 2 is located with its first recess on the second supporting sections 14, 15 in the first supporting plane such that it can be displaced. The second sub-module 3 is located on the first supporting section 12 with its second recess such that it can be displaced. There is a gap between the edges of the recesses and the supporting sections 12, 14, 15. The coating material 4 is subsequently injected into the cavity, wherein the first sub-module 2 and second sub-module 3 are connected to one another therewith, and coated in a media-tight manner, and the gaps between the edges of the recesses and the supporting sections 12, 14, 15 are filled.

Figure 2:
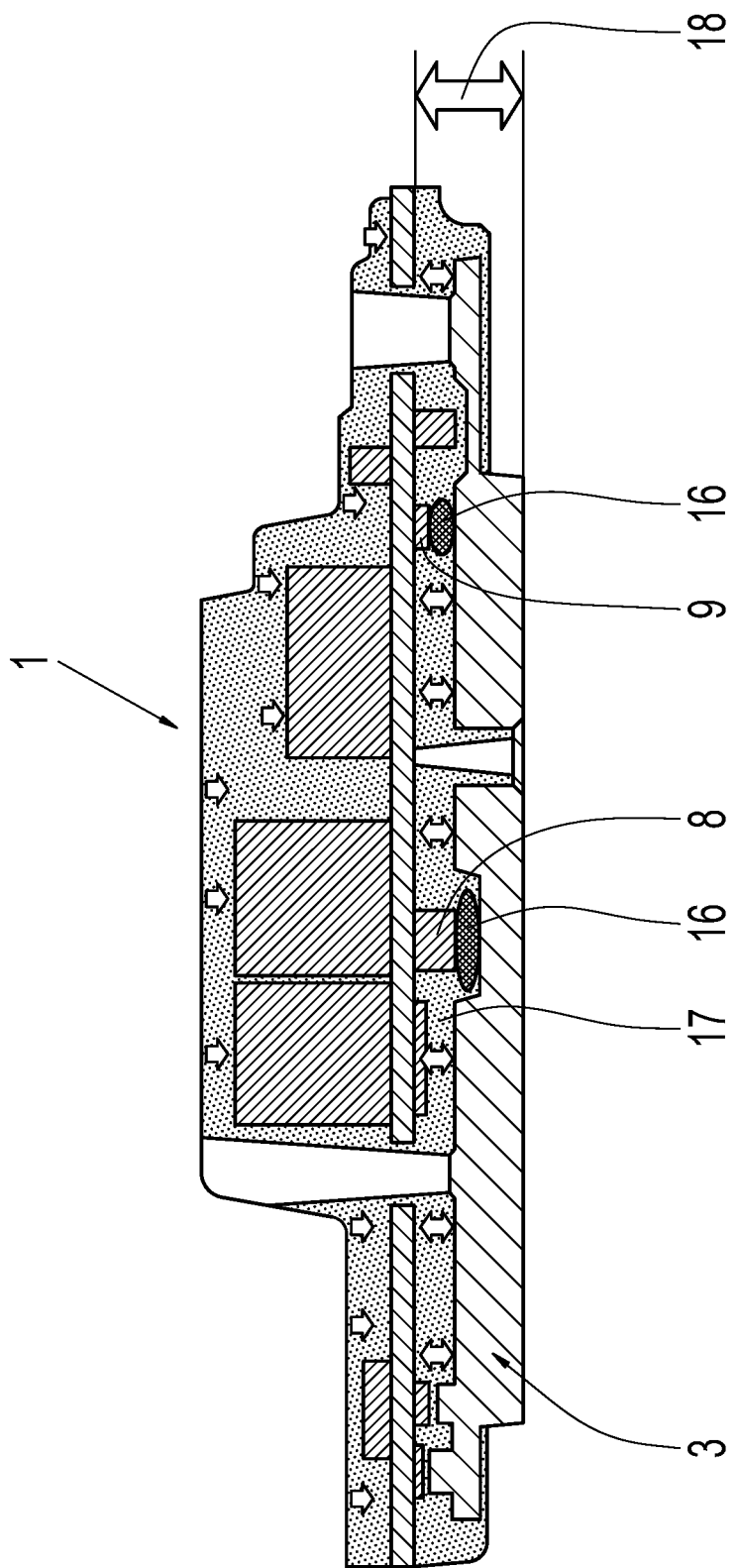
FIG. 2 shows a coated electronic module that has a first sub-module, a second sub-module, and a coating material.

FIG. 2 shows the coated electronic module 1. A heat conducting medium 16 is located between the electronic components 8, 9 and the second sub-module 3 in the form of a heat sink, which supports thermal conductivity between the components 8, 9 and the second sub-module 3. The coating material 4 forms a layer 17 between the first sub-module 2 and the second sub-module 3, wherein the first sub-module 2 and second sub-module 3 are connected to one another in a mechanically contactless manner, such that the sub-modules 2, 3 can move in relation to one another in a direction 18 due to the effects of a chemical and/or thermal shrinkage, and tensions caused by shrinkages are reduced or eliminated.

REFERENCE SYMBOLS

1 electronic module
2 first sub-module
3 second sub-module
4 coating material
5 first tool part
6 second tool part
7 circuit board
8 electronic component
9 electronic component
10 direction
11 first molding surface section
12 first supporting section
13 second molding surface section
14 second supporting section
15 second supporting section
16 heat conducting medium
17 layer
18 direction

We claim:

1. A tool for coating an electronic module, the tool comprising:
    a first tool part and a second tool part that form a cavity between the first tool part and the second tool part, the cavity being configured to receive a flat circuit board,
    wherein the first tool part has a first molding surface section and at least one first supporting section that extends from the first molding surface section towards the second tool part, and
    wherein the second tool part has a second molding surface section and at least one second supporting section that extends from the second molding surface section towards the first tool part,
    wherein a first supporting plane is formed by the at least one first supporting section and a second supporting plane is formed by the at least one second support section,
    wherein the first supporting plane and the second supporting plane are spaced apart and each parallel to a main surface of the circuit board, and
    wherein the second supporting section extends through an opening of the circuit board such that the first supporting plane is located between the second molding surface section and the second supporting plane.

2. The tool according to claim 1, wherein the second supporting plane is located between the first molding surface section and the first supporting plane.

3. The tool according to claim 1, wherein the at least one first supporting section and the at least one second supporting section are offset to one another.

4. The tool according to claim 3, wherein the at least one first supporting section and/or the at least one second supporting section are conical.

5. A tool for coating an electronic module, the tool comprising:

a first tool part, the first tool part having a first molding surface section with a first supporting section extending therefrom, wherein the first supporting section is configured to abut a surface of a circuit board of the electronic module; and a second tool part, the second tool part having a second molding surface section with a second supporting section extending therefrom, wherein the second supporting section is configured to extend through an opening of the circuit board and abut a heat sink of the electronic module, and wherein the first supporting section is configured to extend through an opening of the heat sink and abut the circuit board of the electronic module.

6. The tool of claim 5, wherein a first supporting plane is formed by the first supporting section and a second supporting plane is formed by the second supporting section, wherein the first supporting plane and the second supporting plane are spaced apart and parallel, and wherein the first supporting plane is located between the second molding surface section and the second supporting plane.

7. The tool of claim 5, wherein the second tool part includes a third supporting section, and wherein a plane that extends through a terminus of the second supporting section and a terminus of the third supporting section is parallel to a main surface of the circuit board when the tool is in use.

* * * * *